(12) United States Patent
Chinthakindi et al.

(10) Patent No.: US 8,013,394 B2
(45) Date of Patent: Sep. 6, 2011

(54) INTEGRATED CIRCUIT HAVING RESISTOR BETWEEN BEOL INTERCONNECT AND FEOL STRUCTURE AND RELATED METHOD

(75) Inventors: Anil K Chinthakindi, Haymarket, VA (US); Vincent J McGahay, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1024 days.

(21) Appl. No.: 11/692,336

(22) Filed: Mar. 28, 2007

(65) Prior Publication Data

US 2008/0237800 A1 Oct. 2, 2008

(51) Int. Cl.
*H01L 23/62* (2006.01)
*H01L 21/20* (2006.01)

(52) U.S. Cl. . 257/358; 438/381; 438/384; 257/E21.004; 257/E21.006; 257/E27.026; 257/E27.025; 257/359

(58) Field of Classification Search ................ 438/384, 438/154, 153, 311, 309, 156, 152, 381, 385, 438/330, 329, 210, 190, 171; 257/537, E27.025, 257/E27.035, E27.047, E27.041, 330, 351, 257/358, 359, 360, 363, 576, E21.004, E27.016, 257/E27.071, E21.351, E21.35, E29.218, 257/E29.106, 154, 767, E27.026, E21.006, 257/E21.703
See application file for complete search history.

(56) References Cited

U.S. PATENT DOCUMENTS

| | | | | |
|---|---|---|---|---|
| 5,675,185 | A * | 10/1997 | Chen et al. | 257/774 |
| 5,789,302 | A * | 8/1998 | Mitwalsky et al. | 438/462 |
| 6,271,578 | B1 * | 8/2001 | Mitwalsky et al. | 257/620 |
| 6,500,724 | B1 * | 12/2002 | Zurcher et al. | 438/384 |
| 6,717,233 | B1 * | 4/2004 | Haddad et al. | 257/536 |
| 6,730,573 | B1 | 5/2004 | Ng et al. | |
| 6,902,981 | B2 * | 6/2005 | Ng et al. | 438/381 |
| 7,271,700 | B2 * | 9/2007 | Chinthakindi et al. | 338/309 |
| 7,319,254 | B2 * | 1/2008 | Kwak et al. | 257/305 |
| 7,442,637 | B2 * | 10/2008 | Su et al. | 438/624 |
| 2001/0040271 | A1 | 11/2001 | Duncombe et al. | |
| 2003/0183880 | A1 * | 10/2003 | Goto et al. | 257/379 |
| 2004/0070048 | A1 | 4/2004 | Kwok et al. | |
| 2004/0245575 | A1 | 12/2004 | Beach et al. | |
| 2005/0260822 | A1 * | 11/2005 | Keum et al. | 438/382 |
| 2007/0069334 | A1 * | 3/2007 | Beach et al. | 257/536 |
| 2007/0176295 | A1 * | 8/2007 | Chinthakindi et al. | 257/774 |
| 2007/0181974 | A1 * | 8/2007 | Coolbaugh et al. | 257/536 |
| 2007/0284662 | A1 * | 12/2007 | Chinthakindi et al. | 257/350 |

* cited by examiner

*Primary Examiner* — Matthew C Landau
*Assistant Examiner* — Latanya Crawford
(74) *Attorney, Agent, or Firm* — Joseph J. Petrokaitis; Hoffman Warnick LLC (57) ABSTRACT

Integrated circuits (IC) and a method of fabricating an IC, where the structure of the IC incorporates a back-end-of-the-line (BEOL) thin film resistor below a first metal layer to achieve lower topography are disclosed. The resistor directly contacts any one of: a contact metal in the front-end-of-the-line (FEOL) structure; first metal layer in the BEOL interconnect; or the combination thereof, to avoid the necessity of forming contacts with differing heights or contacts over varying topography.

12 Claims, 7 Drawing Sheets

INTEGRATED CIRCUIT HAVING RESISTOR BETWEEN BEOL INTERCONNECT AND FEOL STRUCTURE AND RELATED METHOD

BACKGROUND

1. Technical Field

The disclosure relates to integrated circuit (IC) chip fabrication, and more particularly, to integrated circuits (IC) with resistors of lower topography and methods of forming a resistor below the first metal layer of a back-end-of-the-line (BEOL) interconnect structure.

2. Related Art

Figure 1:
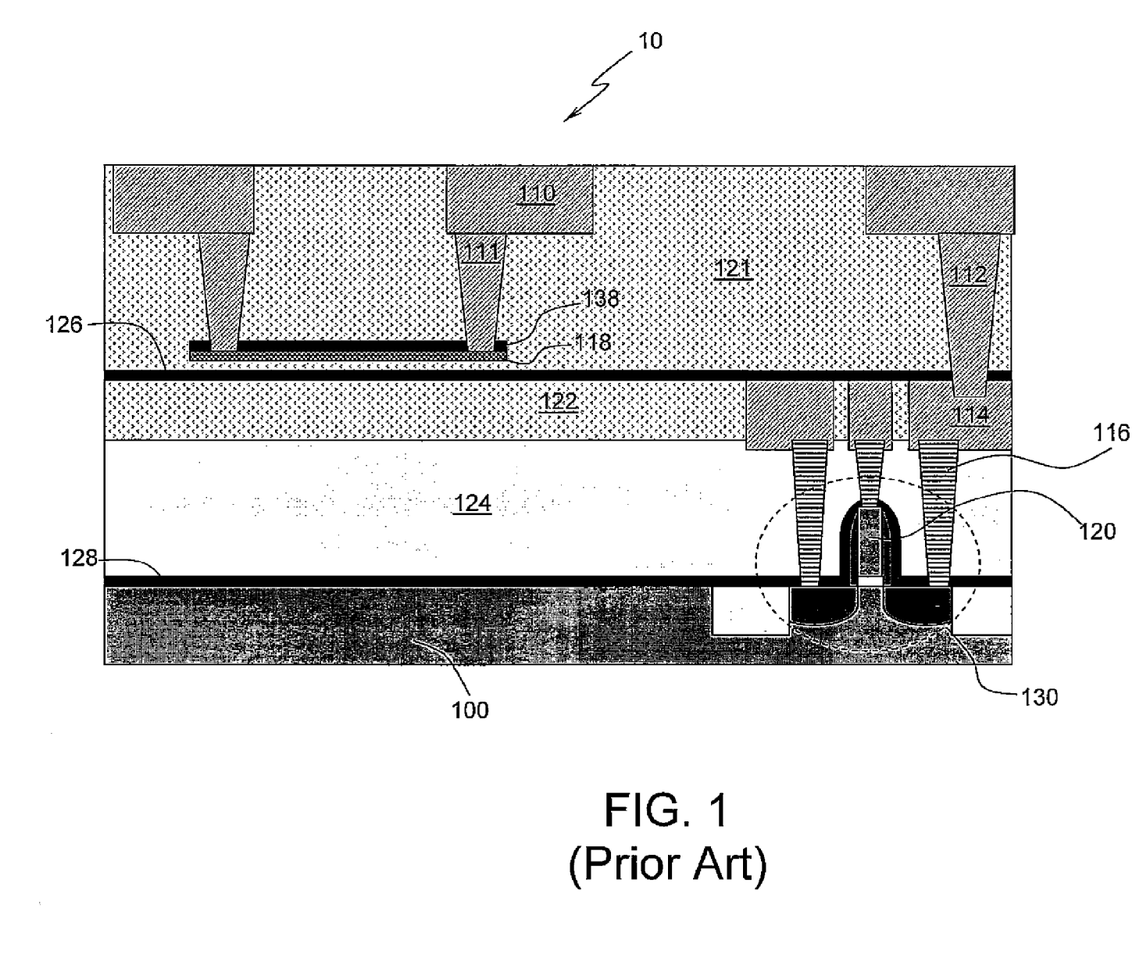
FIG. 1 is a schematic cross-sectional view illustrating a region between the back-end-of the-line (BEOL) and the front-end-of-the-line (FEOL) of an integrated circuit in the prior art where a thin film resistor is formed.

In the current state of the art, thin film resistors in integrated circuits are typically incorporated as part of the back-end-of-the-line (BEOL) interconnect. To establish connectivity between a device in the front-end-of-the-line (FEOL) to a thin film resistor in the BEOL, a wiring path traverses a myriad of connectivity points between many metal layers. The usual wiring path traverses a contact layer; a first metal layer; contacts that connect the metal layers; subsequent metal layers above the first metal layer; multiple thin film resistors; and, in reverse, to the first metal layer and then the contact layer. A simplified example of a typical integrated circuit 10 with such a wiring path is illustrated in FIG. 1. In this example, resistor 118 is connected to device 130 through contacts 116, first metal layer 114, second metal layer 110 and contacts in the BEOL 111, 112, hereinafter, BEOL contacts. The presence of thin film resistor 118 creates a variation in structure or topography which requires a contact formation process capable of forming two distinct types of BEOL contacts: BEOL contact 111, which contacts the resistor, and BEOL contact 112, which contacts the first metal layer. It is difficult to obtain a common process for these two types of BEOL contacts, especially if the height difference between BEOL contact 111 and BEOL contact 112 is large.

In view of the foregoing, it is desirable to configure thin film resistors which do not require formation of contacts of different heights or the creation of contacts of identical heights over varying topography created by the presence of the resistors.

SUMMARY OF THE DISCLOSURE

Integrated circuits (IC) and a method of fabricating an IC, where the structure of the IC incorporates a back-end-of-the-line (BEOL) thin film resistor below a first metal layer to achieve lower topography are disclosed. The resistor directly contacts any one of: a contact metal in the front-end-of-the-line (FEOL) structure; first metal layer in the BEOL interconnect; or a combination thereof, to avoid the necessity of forming contacts with differing heights or contacts over varying topography.

A first aspect of the invention provides an integrated circuit having a first resistor between a back-end-of-the-line (BEOL) interconnect and a front-end-of-the-line (FEOL) structure, the integrated circuit comprising: a first metal layer of the BEOL interconnect disposed above a contact layer of the FEOL structure with the first resistor disposed between the first metal layer and the contact layer, wherein the first resistor is contacted by at least one of: the first metal layer and the contact layer; and a polysilicon member disposed below the contact layer, wherein the polysilicon member is contacted by the contact layer.

A second aspect of the invention provides an integrated circuit having a back-end-of-the-line (BEOL) interconnect and a front-end-of-the-line (FEOL) structure, the integrated circuit comprising: a first metal layer of the BEOL interconnect disposed above a contact layer of the FEOL structure; a second metal layer disposed above the first metal layer; a polysilicon member disposed below the contact layer and contacted by the contact layer; and a plurality of resistors in a substantially parallel configuration, wherein at least one of the plurality of resistors is disposed between the first metal layer and the contact layer; and wherein each of the plurality of resistors is contacted by at least one of: the first metal layer, the second metal layer, the polysilicon member and the contact layer.

A third aspect of the invention provides a method of fabricating an integrated circuit having a first resistor between a back-end-of-the-line (BEOL) interconnect and a front-end-of-the-line (FEOL) structure, the method comprising: forming the first resistor above a contact layer of the FEOL structure; and forming a first metal layer of the BEOL interconnect above the resistor, wherein the first resistor contacts at least one of: the contact layer and the first metal layer.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

The accompanying drawings are not to scale, and are incorporated to depict only typical aspects of the invention. Therefore, the drawings should not be construed in any manner that would be limiting to the scope of the invention. In the drawings, like numbering represents like elements between the drawings.

DETAILED DESCRIPTION

Various embodiments are depicted in the drawings in FIGS. 2-7. The figures illustrate the different aspects of connecting a multiple thin film resistor 218, hereinafter resistor/first resistor 218, incorporated into an integrated circuit (IC) 20 below a first metal layer 214 of a back-end-of-the-line (BEOL) fabrication process.

Figure 2:
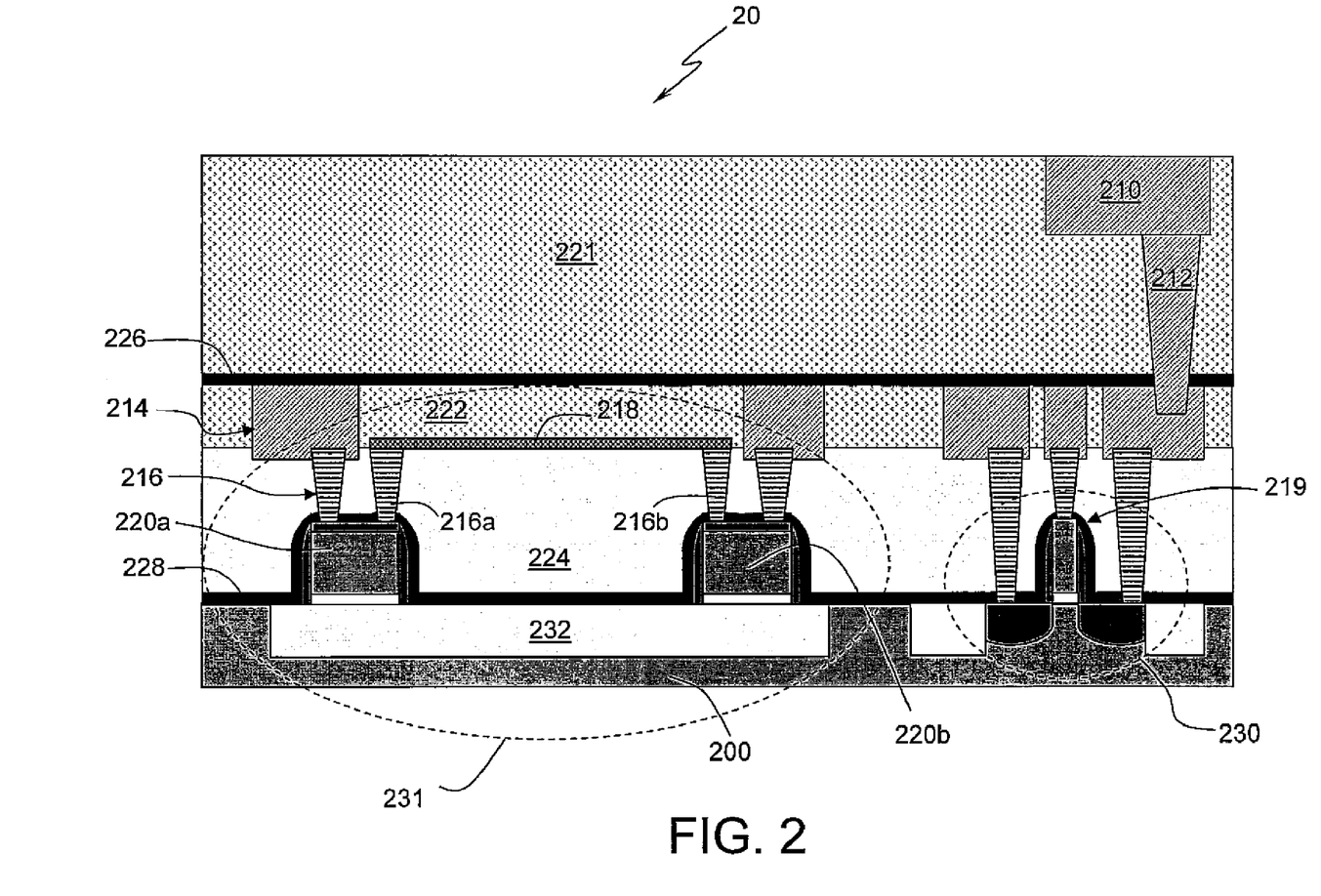
FIGS. 2-7 are cross-sectional views of embodiments illustrating the region between the BEOL and FEOL where thin film resistors are incorporated.

FIG. 2 illustrates an integrated circuit (IC) 20 where multiple layers of interconnect fabricated by the BEOL process are above a structure fabricated with a front-end-of-the-line (FEOL) process. The BEOL portion of the IC begins with a first metal layer 214 while the FEOL portion of the IC ends at the layer prior to first metal layer 214. The FEOL portion is fabricated on a substrate 200 and includes devices 230 and 231 which may be connected by a wiring path (not shown). Such devices 230, 231 usually include one or more polysilicon members 219, 220a, 220b. For example, device 230 may be a transistor where polysilicon member 219 may be a gate; and device 231 includes polysilicon members 220a, 220b as conducting elements over shallow trench isolation (STI) region 232. Polysilicon members 219, 220a, 220b are connected to contact layer 216. Contact layer 216 may in turn be connected to metal layer 214 in the BEOL portion of the IC. Barrier layer 228, formed, for example, by depositing silicon nitride ($Si_3N_4$) on top of polysilicon members 219, 220a, 220b is usually included to facilitate patterning of dielectric layer 224 above polysilicon members 219, 220a, 220b. Usually, contact layer 216 is fabricated, for example, with tungsten (W) using currently known damascene process or any suitable later developed techniques. Following the formation of contact layer 216, a thin film or a stack of multiple thin films of tantalum nitride (TaN) is deposited to form resistor 218. Other materials for forming resistor 218 may include tantalum (Ta), titanium (Ti), titanium nitride (TiN), tungsten (W), and tungsten nitride (WN). Resistor 218 is typically patterned by a combination of photolithographic and subtractive etch techniques. Subsequent to completing the formation of resistor 218, which only contacts 216a and 216b in contact layer 216, dielectric layer 222 is deposited. Dielectric layer 222 may be subjected to planarization such as by chemical mechanical polishing (CMP) in order to facilitate formation of first metal layer 214. Unlike the prior art wiring path shown in FIG. 1, the wiring path to and from resistor 218 does not involve any BEOL contact for contacting with first metal layer 214 or second metal layer 210. Similarly, it is not necessary for resistor 218 to include an accompanying etch-stop cap as compared to etch-stop cap 138 in prior art illustrated in FIG. 1. After the deposition of dielectric layer 222, first metal layer 214 is formed using any currently known damascene process or any suitable later developed techniques. The metal for forming first metal layer 214 is usually copper (Cu) but may include tungsten (W), gold (Au) or other metals with suitable electrical conductivity. A thin diffusion barrier film 226, usually silicon nitride ($Si_3N_4$) or carbon-doped silicon nitride (SiCN), may then be deposited above first metal layer 214. On top of barrier film 226 is deposited an insulator material, dielectric 221. Second metal layer 210 is then formed along with BEOL contact 212 in dielectric 221 with current subtractive or damascene processes or any suitable later developed techniques. BEOL contact 212 connects first metal layer 214 and second metal layer 210. Subsequent BEOL interconnect layers are formed in this similar manner above second metal layer 210. With this configuration, resistor 218 may be connected to other devices not directly connected to resistor 218, for example, device 230, or other wiring (not shown) in the FEOL structure, through polysilicon members 220a. 220b.

The subsequent drawings depicted in FIG. 3-7 illustrate other exemplary embodiments of the configuration of resistor 218 with respect to the first metal layer 214 and contact layer 216.

Figure 3:
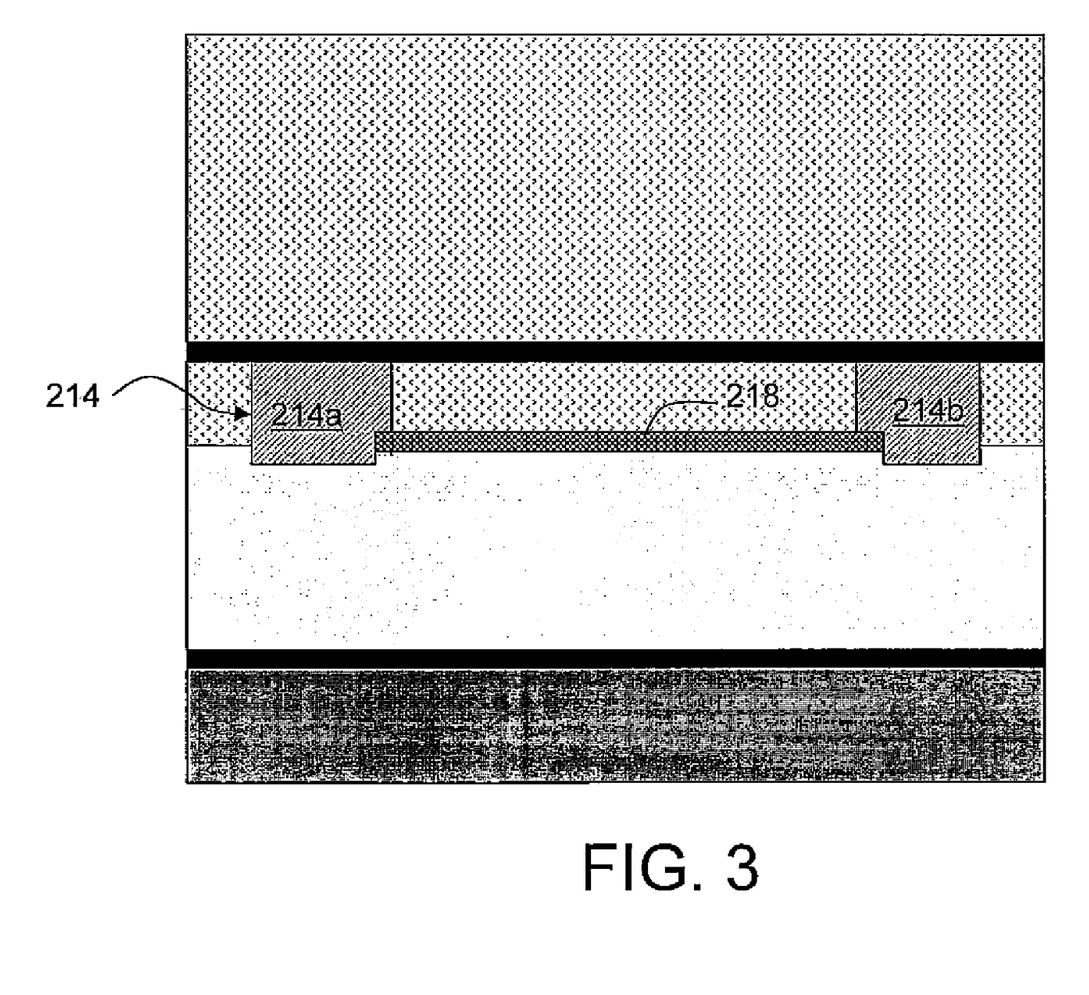

As illustrated in FIG. 3, resistor 218 may be contacted lengthwise on each end by two features 214a, 214b of the first metal layer 214 from above. This configuration presents greater ease of fabrication for interconnect lines as compared to prior art methods in which BEOL contacts are necessary to establish interconnectivity between resistor 218 and devices in the FEOL. As a result, additional flexibility for wiring of the resistor 218 with other devices is possible.

Figure 4:
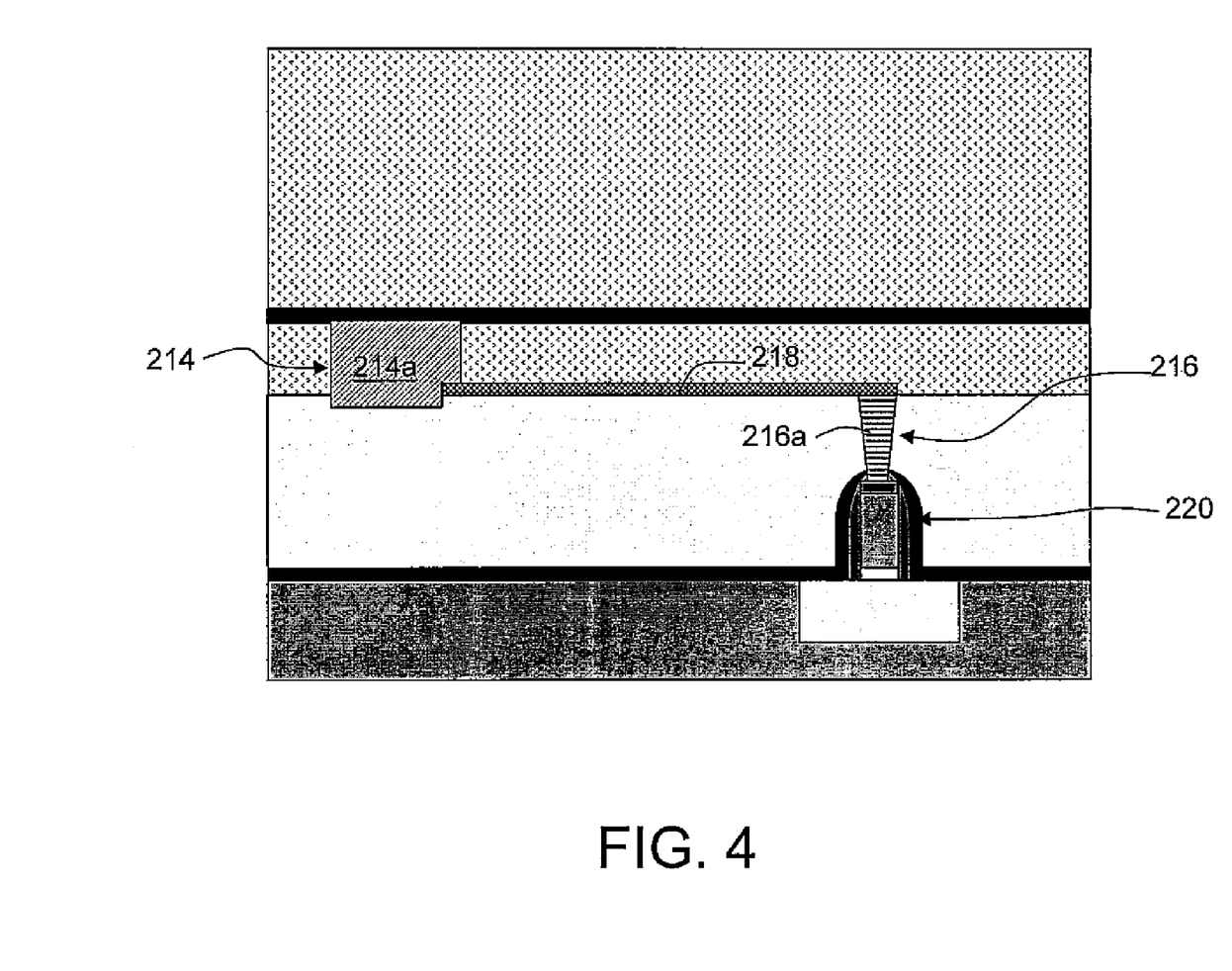

FIG. 4 illustrates a configuration of resistor 218 in contact with both a feature 214a of first metal layer 214 and contact 216a of contact layer 216. Feature 214a of first metal layer 214 contacts one end of resistor 218 from above while contact 216a contacts resistor 218 from below on another end. Contact 216a in turn may be contacted by polysilicon member 220 from below. By establishing connectivity between a metal feature 214a of first metal layer 214 and contact 216a in contact layer 216 without involving BEOL contacts, this configuration provides greater flexibility for wiring resistor 218 with other devices (not shown).

Figure 5:
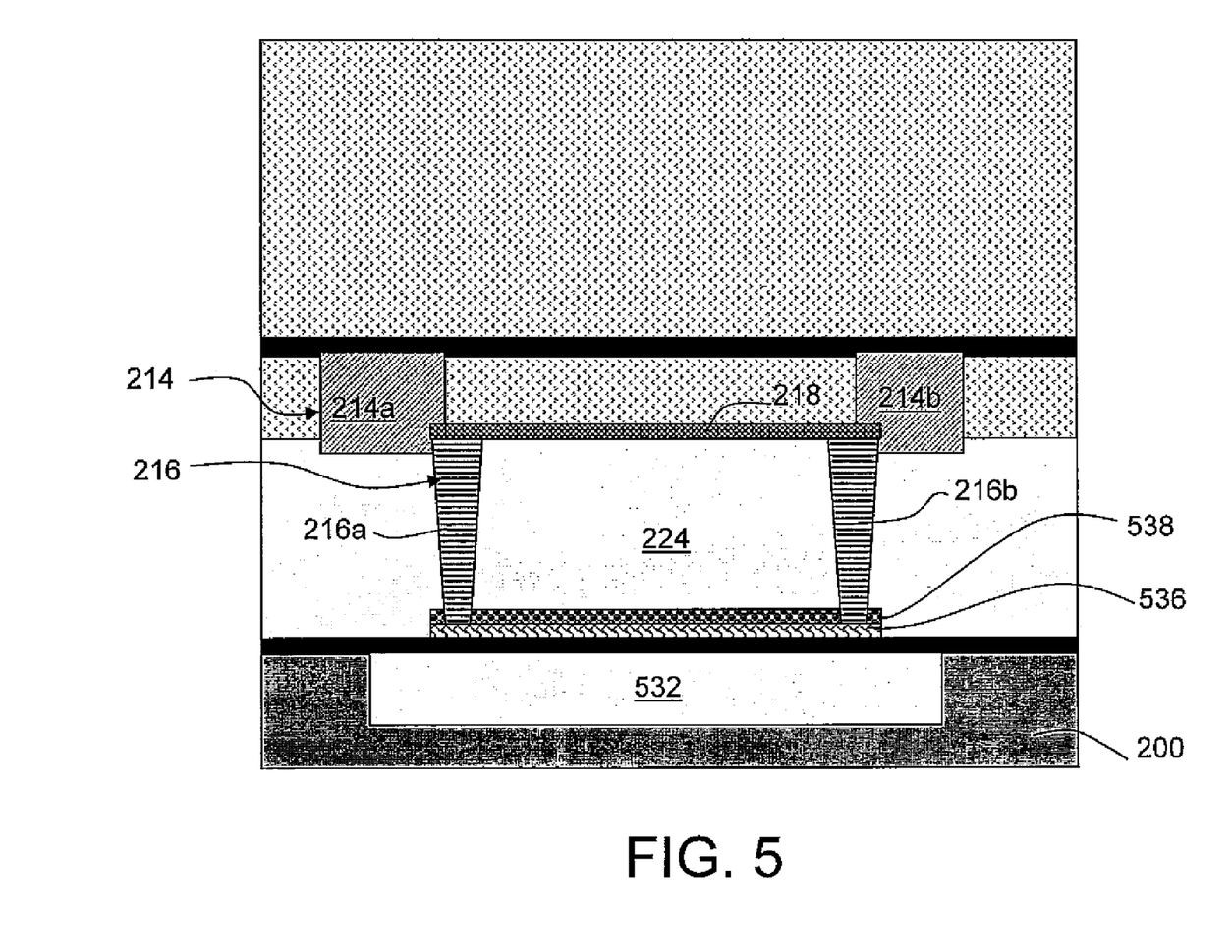

FIG. 5 illustrates first resistor 218, disposed lengthwise between two metal features 214a, 214b of first metal layer 214. At the same time, resistor 218 is contacted by contacts 216a, 216b in contact layer 216 resulting in first resistor 218 being sandwiched between first metal layer 214 from above and contact layer 216 from below. Contacts 216a, 216b further contact second resistor 536 disposed directly below first resistor 218. Barrier layer 228 is usually disposed above substrate 200 or trench isolation 532 before second resistor 536. Both resistors 218, 536 are substantially parallel (i.e., physically) to each other but separated by dielectric 224. Second resistor 536 may be formed of multiple thin films above substrate 200 or trench isolation 532 therein with currently known subtractive processes, or later developed techniques. Second resistor 536 is formed typically incorporating barrier etch stop 538. The materials for forming second resistor 536 may include metals selected form a group consisting of: tantalum nitride (TaN), tantalum (Ta), titanium (Ti), titanium nitride (TiN), tungsten (W), tungsten nitride (WN), and doped polysilicon. Preferably, the metal or combination of metals used in second resistor 536 is different from that used in first resistor 218. The difference in material for forming first resistor 218 and second resistor 536 provides a tailored value of the thermal coefficient of resistivity (TCR) of the pair of resistors wired in parallel.

Figure 6:
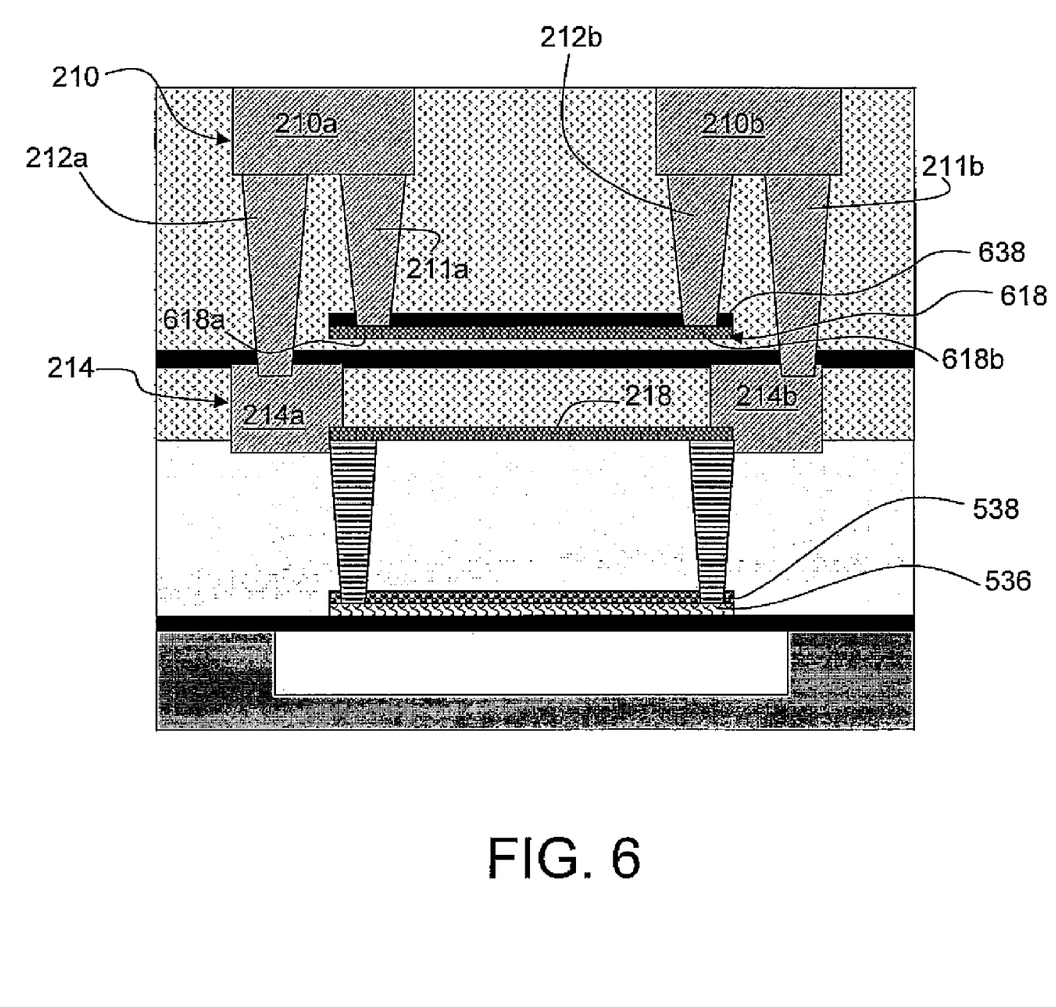

FIG. 6 illustrates a third resistor 618 added to the configuration of first resistor 218 and second resistor 536 as illustrated in FIG. 5. Third resistor 618 is disposed above first metal layer 214 and includes an etch-stop cap 638 directly above. Third resistor 618 is connected at two ends 618a, 618b to first metal layer 214 at features 214a and 214b through a first wiring path that traverses BEOL contact 211a, feature 210a in second metal layer and BEOL contact 212a; and a second wiring path that traverses BEOL contact 211b, feature 210b in second metal layer 210 and BEOL contact 212b. In this configuration, all three resistors 218, 536, 618 are substantially parallel (i.e., physically) with each other. This substantially parallel configuration provides the flexibility of tailoring the TCR value where all three resistors are formed from materials of differing metal stacks.

Figure 7:
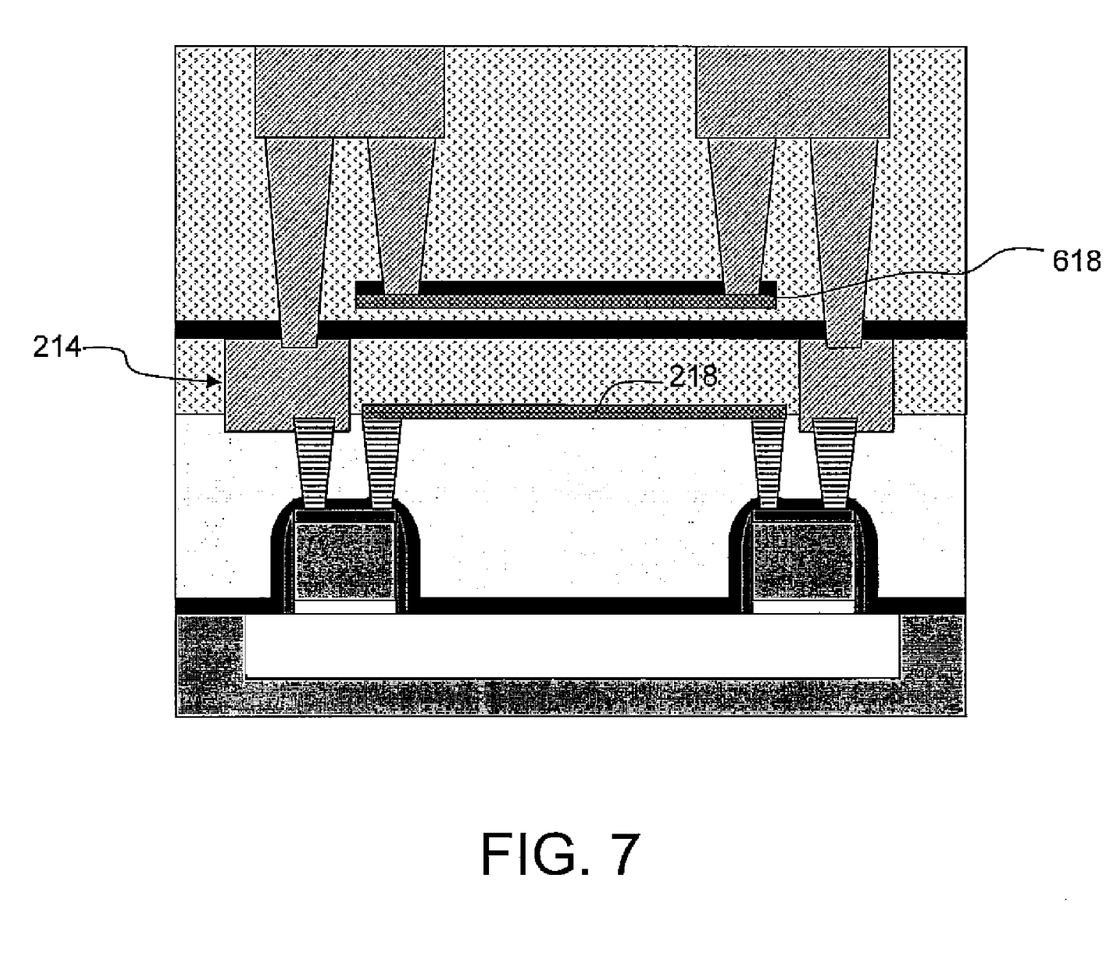

In addition to the foregoing exemplary embodiments, another exemplary embodiment shown in FIG. 7 illustrates another configuration which includes resistor 618 and resistor 218 as illustrated in FIG. 6 where resistor 536 is excluded.

The foregoing description of various aspects of the invention has been presented for purposes of illustration and description. It is not intended to be exhaustive or to limit the scope of the invention to the precise form disclosed, and obviously, many modifications and variations are possible. Such modifications and variations that may be apparent to a person skilled in the art are intended to be included within the scope of the invention as defined by the accompanying claims.

What is claimed is:

1. An integrated circuit having a first resistor between a back-end-of-the-line (BEOL) interconnect and a front-end-of-the-line (FEOL) structure, the integrated circuit comprising:

a first metal layer of the BEOL interconnect disposed above a contact layer of the FEOL structure with the first resistor disposed between the first metal layer and the contact layer, wherein the first resistor is contacted by the first metal layer and the contact layer;

a second resistor disposed above the first metal layer, wherein the second resistor is connected to the first metal layer through a wiring path that traverses at least two contacts and a second metal layer of the BEOL interconnect; and a polysilicon member disposed below the contact layer, wherein the polysilicon member is contacted by the contact layer.

2. The integrated circuit of claim 1, wherein the first resistor is connected to a device in the FEOL structure through the polysilicon member.

3. The integrated circuit of claim 1, wherein the first resistor includes at least a thin film of metal selected form a group consisting of: tantalum nitride (TaN), tantalum (Ta), titanium (Ti), titanium nitride (TiN), tungsten (W) and tungsten nitride (WN).

4. The integrated circuit of claim 1, wherein the second resistor includes an etch stop cap.

5. The integrated circuit of claim 1, wherein the first and second resistors are in a substantially parallel configuration.

6. The integrated circuit of claim 3, wherein the second resistor includes at least a thin film of metal selected form a group consisting of: tantalum nitride (TaN), tantalum (Ta), titanium (Ti), titanium nitride (TiN), tungsten (W), tungsten nitride (WN) and doped polysilicon.

7. The integrated circuit of claim 6, wherein the first and second resistors are formed from differing materials.

8. An integrated circuit having a back-end-of-the-line (BEOL) interconnect and a front-end-of-the-line (FEOL) structure, the integrated circuit comprising:

a first metal layer of the BEOL interconnect disposed above a contact layer of the FEOL structure;

a second metal layer disposed above the first metal layer;

a polysilicon member disposed below the contact layer and contacted by the contact layer; and a plurality of resistors in a substantially parallel configuration, the plurality of resistors including:

a first resistor disposed between the first metal layer and the contact layer, wherein the first resistor contacts the first metal layer and the contact layer; and a second resistor disposed above the first metal layer, wherein the second resistor is connected to the first metal layer through a wiring path that traverses at least two contacts and the second metal layer of the BEOL interconnect.

9. The integrated circuit of claim 8, wherein the plurality of resistors are separated by at least an intervening layer of dielectric material.

10. A method of fabricating an integrated circuit having a first resistor between a back-end-of-the-line (BEOL) interconnect and a front-end-of-the-line (FEOL) structure, the method comprising:

forming the first resistor above a contact layer of the FEOL structure;

forming a first metal layer of the BEOL interconnect above the resistor; and forming a second resistor above the first metal layer, wherein the second resistor is connected to the first metal layer through a wiring path that traverses two contacts and a second metal layer formed above the first metal layer, and wherein the second resistor is substantially parallel to the first resistor; and wherein the first resistor contacts the contact layer and the first metal layer.

11. The method according to claim 10, wherein the first resistor and the second resistor are formed from differing materials.

12. The method according to claim 10, further comprising depositing an etch stop layer above the second resistor.

* * * * *